United States Patent
Albert et al.

(10) Patent No.: US 7,514,947 B2
(45) Date of Patent: Apr. 7, 2009

(54) METHOD OF AND SYSTEM FOR FUNCTIONALLY TESTING MULTIPLE DEVICES IN PARALLEL IN A BURN-IN-ENVIRONMENT

(75) Inventors: Jason T. Albert, Rochester, MN (US); William T. Bronk, Shelburne, VT (US); Timothy J. Eby, Austin, TX (US); Michael J. Hamilton, Rochester, MN (US); Norman K. James, Liberty Hill, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/848,282

(22) Filed: Aug. 31, 2007

(65) Prior Publication Data

US 2009/0058450 A1   Mar. 5, 2009

(51) Int. Cl.
G01R 31/02 (2006.01)
G01R 31/26 (2006.01)

(52) U.S. Cl. .................................... 324/760; 324/765
(58) Field of Classification Search .................. 324/760
See application file for complete search history.

(56) References Cited

U.S. PATENT DOCUMENTS

| 4,746,855 | A * | 5/1988 | Wrinn | 324/763 |
| 5,029,168 | A * | 7/1991 | Chan | 714/27 |
| 6,229,325 | B1 * | 5/2001 | Browning et al. | 324/760 |
| 7,038,479 | B1 * | 5/2006 | Siddiqui et al. | 324/760 |
| 2005/0156586 | A1 * | 7/2005 | Kanbayashi | 324/76.53 |
| 2006/0290366 | A1 * | 12/2006 | Kon et al. | 324/760 |

OTHER PUBLICATIONS

P. Gillis et al, "Test Methodologies and Design Automation for IBM ASICs," IBM J. Res. Develop. 40, No. 4, 461-474 (Jul. 1996).

* cited by examiner

*Primary Examiner*—Ha Tran T Nguyen
*Assistant Examiner*—Roberto Velez
(74) *Attorney, Agent, or Firm*—Casimer K. Salys; Dillon & Yudell LLP

(57) ABSTRACT

A method of and a system for testing semiconductor devices heat a plurality of devices to a burn-in temperature, and perform functional tests in parallel on the plurality of devices at the burn-in temperature. Systems include a burn-in oven and a test multiplexer. The burn-in oven is adapted to receive and heat the devices to the burn-in temperature. The test multiplexer is adapted to apply functional test signals to and receive output signals from the devices in the burn-in oven.

19 Claims, 2 Drawing Sheets

METHOD OF AND SYSTEM FOR FUNCTIONALLY TESTING MULTIPLE DEVICES IN PARALLEL IN A BURN-IN-ENVIRONMENT

BACKGROUND OF THE INVENTION

1. Technical Field

The present invention relates generally to the field of semiconductor test and quality assurance methodologies, and more particularly to a method of and system for functionally testing multiple semiconductor devices in parallel in a burn-in environment.

2. Description of the Related Art

An important part of the semiconductor device manufacturing process is testing. Before devices can be shipped to customers, the devices must be tested to determine if the devices perform their intended and advertised functions. Such testing is referred to as functional testing.

Experience is shown that an electronic device will most likely fail in the early part of its operating life if it is prone to failure. The failure rate than levels off throughout the devices normal life and again increases when the device becomes old. Failure during the device's early life is referred to as early life failure, or infant mortality.

Burn-in is an electrical stress test that employs voltage and temperature to accelerate the electrical failure of a device. Burn-in essentially simulates the operating the operating life of the device. Burn-in is usually done at 125° Celsius, with electrical excitation applied to the devices. The burn-in process is facilitated by using burn-in boards upon which devices are loaded. The burn-in boards are then inserted into a burn-in oven, which supplies the necessary voltages to the devices while maintaining the devices at the burn-in temperature. The electrical bias applied may be either static or dynamic, depending upon the failure mechanism being accelerated. Devices are typically maintained at the burn-in temperature from 48 to 168 hours. Devices that survive burn-in should, if they are operated within the rated limits, have low and predictable failure rates.

Currently, burn-in and functional testing are performed separately. Separate burn-in and functional testing increases device manufacture and shipping time.

SUMMARY OF THE INVENTION

The present invention provides a method of and a system for testing semiconductor devices. Embodiments of the method and system of the present invention simultaneously heat a plurality of devices to a burn-in temperature, and simultaneously perform functional tests on the plurality of devices at the burn-in temperature. Embodiments of the systems according to the present invention include a burn-in oven and a test multiplexer. The burn-in oven is adapted to receive and heat the devices to the burn-in temperature. The test multiplexer is adapted to apply signals to and receive signals from the devices in the burn-in oven.

BRIEF DESCRIPTION OF THE DRAWINGS

The novel features believed characteristic of the invention are set forth in the appended claims. The invention itself, however, as well as a preferred mode of use, further purposes and advantages thereof, will best be understood by reference to the following detailed description of an illustrative embodiment when read in conjunction with the accompanying drawings, where:

DETAILED DESCRIPTION OF THE PREFERRED EMBODIMENT

Figure 1:
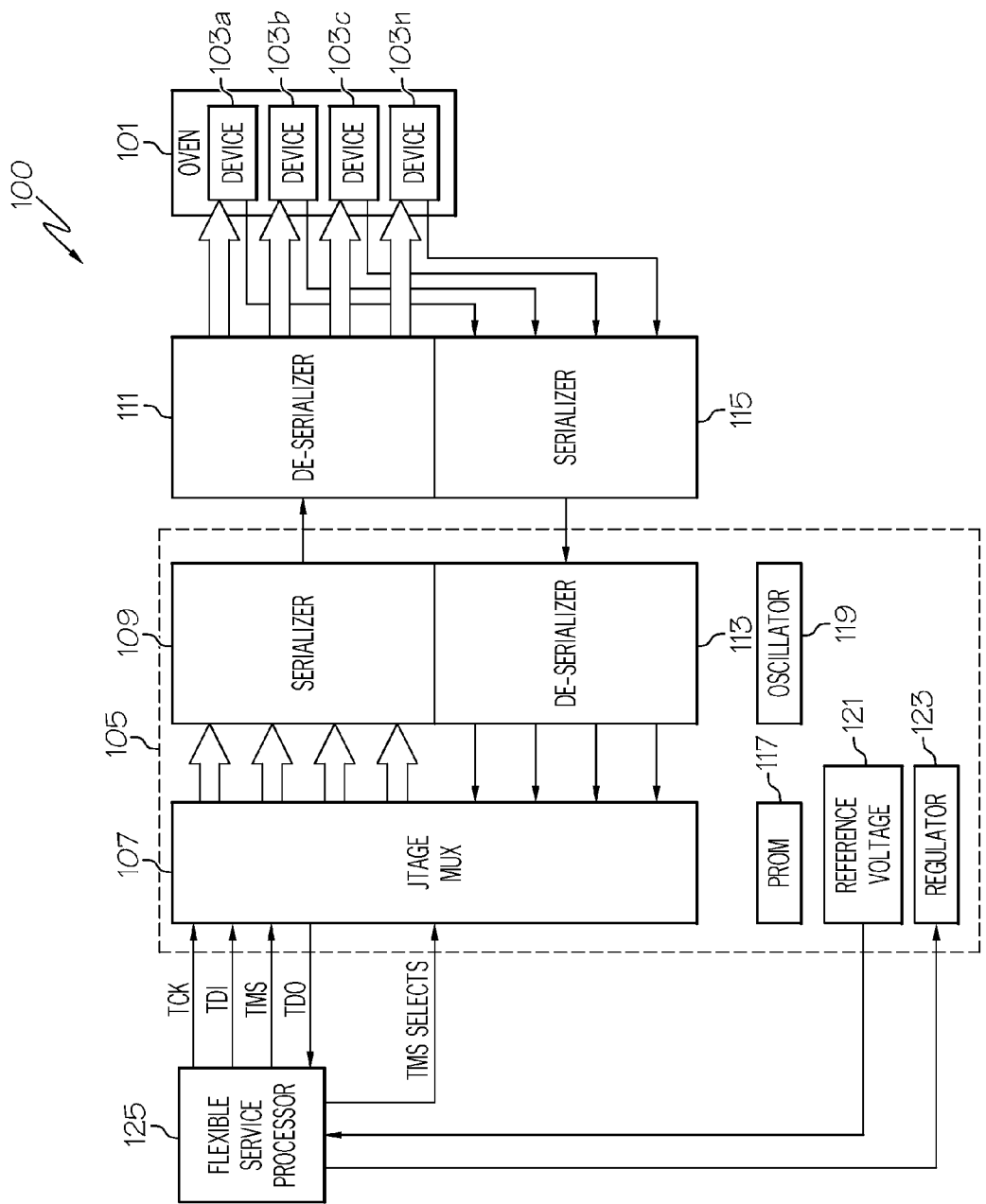
FIG. 1 is a block diagram of an embodiment of a test system according to the present invention; and, FIG. 2 is a flow chart of an embodiment of a method according to the present invention.

Referring now to the drawings, and first to FIG. 1, a system according to the present invention is designated generally by the numeral 100. System 100 includes a burn-in oven 101. A burn-in oven 101 is adapted to receive a plurality of devices 103 being tested. The burn-in oven 101 is adapted to heat devices 103 to a burn-in temperature of at least 100° C. and preferably 125° C. and maintain devices 103 at the burn-in temperature from 48 hours to 168 hours. In the preferred embodiment, a burn-in oven 101 is sized to accommodate fifty-six devices 101.

System 100 includes a joint test action group (JTAG) system 105 and a flexible service processor 125. JTAG system 105 is designed to multiplex JTAG test signals from flexible service processor 125 to devices 103 in burn-in oven 101. JTAG system 105 includes a JTAG multiplexer 107. JTAG multiplexer 107 is coupled to receive test, select, and control signals from flexible service processor 125. JTAG multiplexer 107, under control of flexible service processor, provides the ability to select an individual target device 103, all target devices 103, or any subset of target devices 103.

JTAG multiplexer 107 is coupled to provide test signals in parallel to a serializer 109. Serializer 109 converts parallel signals to a serial bit stream. Serializer 109 is coupled to a de-serializer 111, which converts the serial bit stream back to parallel signals. De-serializer 111 is coupled to provide parallel test signals to devices 103 contained within burn-in oven 101. JTAG multiplexer 107 is coupled to receive test data signals in parallel from a de-serializer 113. Deserializer 113 is coupled to receive a parallel bit stream from a serializer 115. Serializer 115 is coupled to receive test data signals from devices 103 housed in burn-in oven 101. JTAG multiplexer 107 is configured to demultiplex signals received from de-serializer 113 under control of flexible service processor 125.

JTAG system 105 includes a programmable read-only memory (PROM) 117 and an oscillator 119. PROM 117 stores configuration and programming information for JTAG system 105. Oscillator 119 controls scan speed for JTAG system 105. JTAG system 105 also includes reference voltage circuitry 121 and regulator circuitry 123, which provide selectable voltage levels for signals multiplexed to target devices 103 under control of flexible service processor 125.

Flexible service processor 125 cooperates with JTAG system 105 to test devices 103 and burn-in oven 101. Flexible service processor 125 is coupled to provide test clock (TCK), test data in (TDI), and test mode select (TMS) signals to, and receive test data out (TDL) signals from, JTAG multiplexer 107. Flexible service processor 125 provides TMS selects signals to JTAG multiplexer 107 to apply test signals to selected ones of devices 103 housed in burn-in oven 101. In the preferred embodiment, TMS select signals are provided through a seven-line bus, thereby allowing 128 selections. Flexible service processor 125 receives reference voltage signals from reference voltage circuitry 121 of JTAG system 105 and provides control signals to regulator 123 of JTAG system 105, monitoring and controlling the voltage of signals supplied to devices 103.

Figure 2:
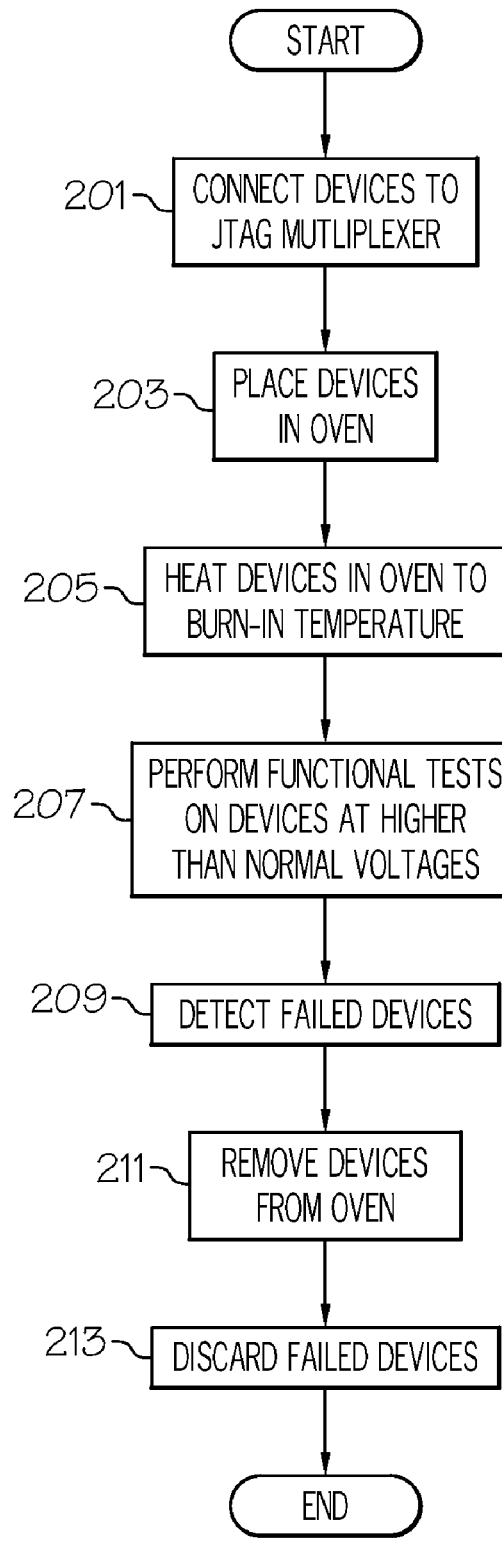

FIG. 2 is a process flow diagram of a method according to the present invention. At step 201, the devices to be tested are connected to the JTAG multiplexer. Then, the devices are placed in the burn-in oven, at step 203. Then, the burn-in oven is heated to the burn-in temperature, at step 205. The burn-in temperature is at least 100° C. and may be as high as 125° C. The devices may be maintained at the burn-in temperature from 48 to 168 hours. While the devices are maintained at the burn-in temperature, functional tests are performed on the devices, at step 207. The functional tests may be performed at higher than normal operating voltages.

Functional tests may include tests of memory coherency, bus interactions, interprocessor communication, I/O functionality, and the like. Test cases may be built using random instruction streams. Random operations are selected and test code stream is built and saved. Then, the random test code stream is run on selected devices. Certain devices may fail as a result of the functional tests performed under burning conditions. The system detects the fail devices, at step 209. At the completion of burn-in testing, the devices are allowed to cool and are removed from the burn-in oven, at step 211. Additional functional tests may be performed during the cooling period. After the devices have been removed from the burn-in oven, the failed devices are discarded, as indicated at step 213.

From the foregoing, it will be apparent to those skilled in the art that systems and methods according to the present invention are well adapted to overcome the shortcomings of the prior art. While the present invention has been described with reference to presently preferred embodiments, those skilled in the art, given the benefit of the foregoing description, will recognize alternative embodiments. Accordingly, the foregoing description is intended for purposes of illustration and not of limitation.

What is claimed is:

1. A method of testing semiconductor devices, said method comprising:
    simultaneously heating a plurality of devices to a burn-in temperature;
    producing a set of device functional test input signals;
    producing a test select signal;
    producing a voltage control signal;
    multiplexing said set of device functional test input signals to selected ones of said devices selected according to said test select signal at said burn-in temperature;
    applying said set of device functional test input signals to said selected ones of said devices at a test voltage according to said voltage control signal;
    receiving device functional test output signals from said selected ones of said devices at said burn-in temperature; and,
    demultiplexing device functional test output signals received from said selected ones of said devices at said burn-in temperature.

2. The method as claimed in claim 1, wherein:
    test voltage is higher than a normal operating voltage for said selected devices.

3. The method as claimed in claim 1, further comprising: detecting failed devices at said burn-in temperature.

4. The method as claimed in claim 3, further comprising: rejecting said failed devices.

5. The method as claimed in claim 1, further comprising: serializing said device functional test input signals multiplexed to said selected devices.

6. The method as claimed in claim 5, further comprising: de-serializing said serialized device functional test input signals.

7. The method as claimed in claim 1, further comprising: serializing said device functional test output signals prior to demultiplexing said device functional test output signals.

8. The method as claimed in claim 7, further comprising: de-serializing said serialized device functional test output signals prior to demultiplexing said device functional test signals.

9. The method as claimed in claim 1, wherein said burn-in temperature is at least 100° C.

10. The method as claimed in claim 9, wherein said burn-in temperature is at least 125° C.

11. The method as claimed in claim 1, further comprising: maintaining said devices at said burn-in temperature for at least 48 hours.

12. The method as claimed in claim 11, further comprising: maintaining said devices at said burn-in temperature for at least 168 hours.

13. A semiconductor device testing system, which comprises:
    a burn-in oven adapted to receive a plurality of devices;
    a flexible service processor, said flexible service processor being configured to generate device test input signals and receive device test output signals, said flexible service processor being further configured to generate test select signals and voltage control signals;
    a test multiplexer connected to receive device test signals from said flexible service processor and supply device test output signals to said flexible service processor, said test multiplexer being configured to multiplex said device test signals to selected devices in said burn-in oven under control of said test select signals at selected voltages under control of said voltage control signals, said test multiplexer being further configured to receive device test output signals from said devices and selectively provide device test output signals from selected devices under control of said test select signals.

14. The system as claimed claim 13, wherein said test multiplexer comprises:
    a Joint Test Action Group multiplexer.

15. The system as claimed in claim 13, further comprising:
    a first serializer connected to receive parallel multiplexed device test input signals from said test multiplexer and convert said parallel multiplexed device test input signals to a serial input bit stream;
    a first de-serializer connected to receive said serial input bit stream and convert said serial input bit stream to parallel device test input signals, said first de-serializer being further connected to supply said parallel device test input signal to said devices in said burn-in oven;
    a second serializer connected to receive parallel test output signals from said devices in said burn-in oven and convert said parallel test output signals to a serial output bit stream;
    a second de-serializer connected to receive said serial output bit stream and convert said serial output bit stream to parallel output signals, said second de-serializer being further connected to supply said parallel output signals to said test multiplexer.

16. The system as claimed in claim 13, wherein said burn-in oven is adapted to maintain said devices at a burn-in temperature of at least 100° C.

17. The system as claimed in claim 16, wherein said burn-in oven is adapted to maintain said devices at a burn-in temperature of at least 125° C.

18. The system as claimed in claim 16, wherein said burn-in oven is adapted to maintain said devices at said burn-in temperature for at least 48 hours.

19. The system as claimed in claim 16, wherein said burn-in oven is adapted to maintain said devices at said burn-in temperature for at least 168 hours.

* * * * *